United States Patent [19]
Kang et al.

[11] Patent Number: 5,771,198
[45] Date of Patent: Jun. 23, 1998

[54] SOURCE VOLTAGE GENERATING CIRCUIT IN SEMICONDUCTOR MEMORY

[75] Inventors: Bok-Moon Kang; Seung-Moon Yoo, both of Suwon, Rep. of Korea

[73] Assignee: Samsung Electronics Co. Ltd., Suwon, Rep. of Korea

[21] Appl. No.: 636,115

[22] Filed: Apr. 22, 1996

[30] Foreign Application Priority Data

Apr. 26, 1995 [KR] Rep. of Korea ............ 1995/9968

[51] Int. Cl.[6] ............................................. G11C 7/00
[52] U.S. Cl. .................. 365/229; 365/222; 365/223
[58] Field of Search ............................. 365/222, 203, 365/227, 229

[56] References Cited

U.S. PATENT DOCUMENTS

| | | | |
|---|---|---|---|
| 4,683,382 | 7/1987 | Sakurai et al. | 365/227 |
| 5,291,452 | 3/1994 | Hotta | 365/227 |
| 5,295,112 | 3/1994 | Taniguchi | 365/227 |
| 5,420,528 | 5/1995 | Shigehara | 365/227 |
| 5,539,692 | 7/1996 | Kajigaya et al. | 365/222 |
| 5,550,781 | 8/1996 | Sugawara et al. | 365/222 |
| 5,568,440 | 10/1996 | Tsukude et al. | 365/227 |
| 5,587,958 | 12/1996 | Kaneko et al. | 365/222 |
| 5,594,699 | 1/1997 | Nomura et al. | 365/222 |

Primary Examiner—A. Zarabian
Attorney, Agent, or Firm—Marger, Johnson, McCollom, & Stolowitz P.C.

[57] ABSTRACT

An internal power supply circuit for a semiconductor memory device comprising a differential amplifier having a reference voltage as an input and utilizing an external power supply voltage. An amplifier output provides an internal power supply voltage. The amplifier is connected to a current source which comprises a plurality of transistors connected in series between one side of said amplifier and ground. A current control transistor having a channel larger than the channels of the transistors connected in series is switchable between a first state in which the current control transistor is substantially on and a second state in which said current control transistor is substantially off.

13 Claims, 3 Drawing Sheets

SOURCE VOLTAGE GENERATING CIRCUIT IN SEMICONDUCTOR MEMORY

BACKGROUND OF THE INVENTION

1. Field of the Invention

The present invention relates to an internal power supply for a semiconductor memory device and more particularly to such a power supply which consumes reduced current while the memory device is operating in a self-refresh mode.

The present invention is based on Korean Application No. 9968/1995 which is incorporated herein by reference for all purposes.

2. Description of the Related Art

Generally, a semiconductor memory device has an external power supply (hereinafter referred to as EVcc) and an internal power supply (hereinafter referred to as IVcc). The internal source voltage IVcc has a voltage level lower than that of the external source voltage EVcc. Also, a semiconductor memory device such as a dynamic random access memory (hereinafter referred to as DRAM) has an active mode, for accessing a memory cell array, and a stand-by mode. In the prior art, the active mode includes a read/write mode for reading and writing information stored at a memory cell and a refresh mode for preventing the information in the memory cell from being lost. The stand-by mode is a rest mode. The internal power supply operates in the active mode and in the stand-by mode. The trend for semiconductor memory devices is to provide designs which have low power requirements.

FIG. 1 is a block diagram illustrating prior art power supply circuit used in a stand-by mode in a conventional semiconductor memory device. In FIG. 1, a PMOS transistor 11 is connected between an external power supply voltage EVcc and a node N3. A PMOS transistor 12 is connected between the external source voltage EVcc and a node N5. Gate electrodes of PMOS transistors 11, 12 are commonly coupled to node N5. An NMOS transistor 13 is connected between node N3 and a node N4. A gate electrode of transistor 13 is coupled to a node N1 to which a reference voltage Vref is applied. An NMOS transistor 14 is connected between node N5 and node N4. The gate of transistor 14 is coupled to a node N2 which supplies the internal power supply voltage IVcc generated by the circuit of FIG. 1. Each gate electrode of at least two or more NMOS transistors 21-2N, which are serially connected between node N4 and a ground voltage Vss, is connected in common to node N4. A PMOS transistor 15 is connected between the external power supply voltage EVcc and node N2. The gate of transistor 15 is coupled to node N3.

The circuit of FIG. 1 operates in part as a differential amplifier having Vref as a first input and a feedback signal proportional to IVcc as a second input. The first input signal, reference voltage Vref, sets the internal source voltage IVcc at a desired voltage level. The direct current (DC) of the differential amplifier circuit is determined by NMOS transistors 21-2N.

When voltage IVcc on node N2 is lower than reference voltage Vref, NMOS transistor 13 is biased to conduct more than NMOS transistor 14, thereby causing the potential of node N3 to drop. When the potential of node N3 drops, PMOS transistor 15 is biased to a substantially conducting condition thereby causing the potential of node N2 to raise. That is, the potential of the internal power supply voltage IVcc raises.

On the other hand, when voltage IVcc is higher than that of Vref, NMOS transistor 13 conducts less than NMOS transistor 14, thereby causing the potential of node N3 to rise. When the potential of node N3 rises, PMOS transistor 15 is biased to a substantially nonconducting condition, thereby preventing current flow from voltage EVcc to the internal power supply voltage IVcc. Accordingly, NMOS transistors 13, 14 variably conduct responsive to the potential difference between Vref and voltage IVcc, IVcc is continuously maintained at voltage Vref. The NMOS transistors 21-2N connected in series between the node N4 and the ground voltage Vss form a constant direct current path.

As stated previously, the internal power supply circuit during the stand-by mode supplies row address buffers and circuits with a power supply adequate for rapid operation of row address buffers and circuits which are operated before the active mode. Accordingly, NMOS transistors 21, 2N always form a sufficient current path for stable operation in both active and stand-by modes. However, since NMOS transistors 21, 2N always form a current path of constant size in the stand-by mode, when row address strobe precharge and refresh operations during a self-refresh mode are performed, unnecessary current consumption occurs.

SUMMARY OF THE INVENTION

It is therefore an object of the present invention to provide an internal power supply voltage circuit for a semiconductor memory device in which current consumption during a stand-by mode self refresh operation is reduced.

It is another object of the present invention to provide such a circuit which is comprised of a plurality of current paths which are selected in accordance with consumption power during a stand-by mode.

It is further another object of the present to provide such a circuit for a dynamic random access memory which is comprised of a first path and a second path that are controlled in accordance with power consumption during a stand-by mode thereby reducing unnecessary power consumption.

These and other objects can be achieved according to the principles of the present invention with such a circuit which comprises an amplifier, a first node on the amplifier for receiving a reference voltage, a second node on the amplifier for receiving a first side of an external power supply voltage, and a third node on the amplifier for supplying an internal power supply voltage. A fourth node on the amplifier is operatively connected to a current source. The current source comprises a plurality of transistors connected in series between the fourth node and a second side of the external power supply voltage. A current control transistor has a channel larger than the channels of the transistors connected in series. The current control transistor is switchable between a first state in which the current control transistor is substantially on and a second state in which the current control transistor is substantially off.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings, in which like reference symbols indicate the same or similar structure, wherein.

DETAILED DESCRIPTION OF THE PREFERRED EMBODIMENT

Figure 1:
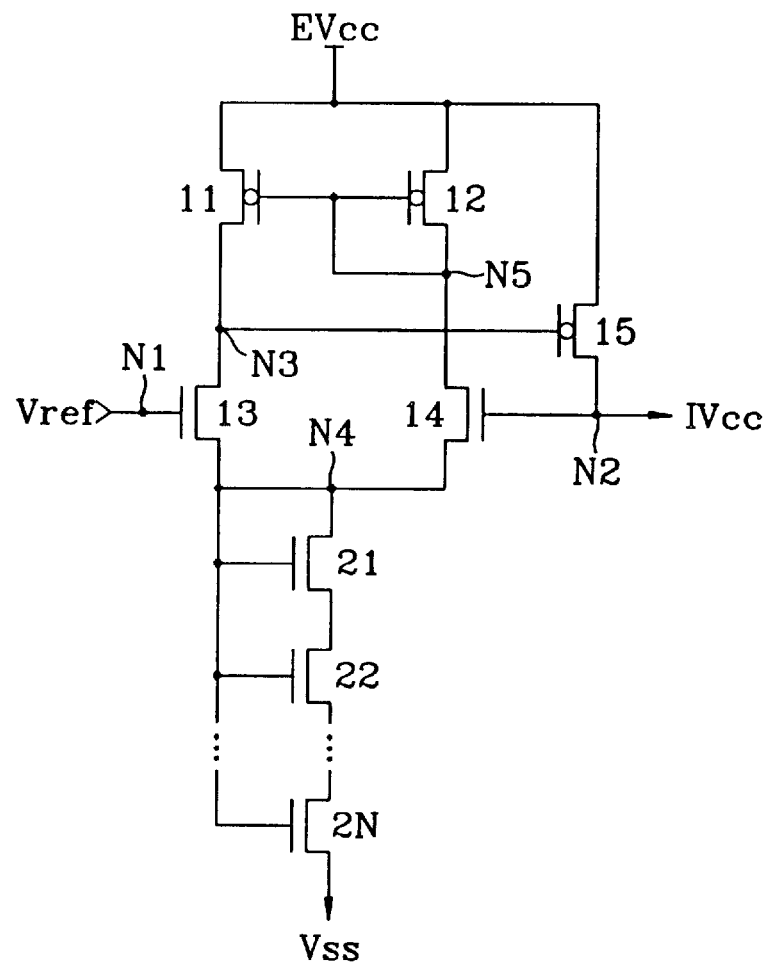
FIG. 1 is a block diagram illustrating an internal power supply circuit in a conventional semiconductor memory device.
Figure 2:
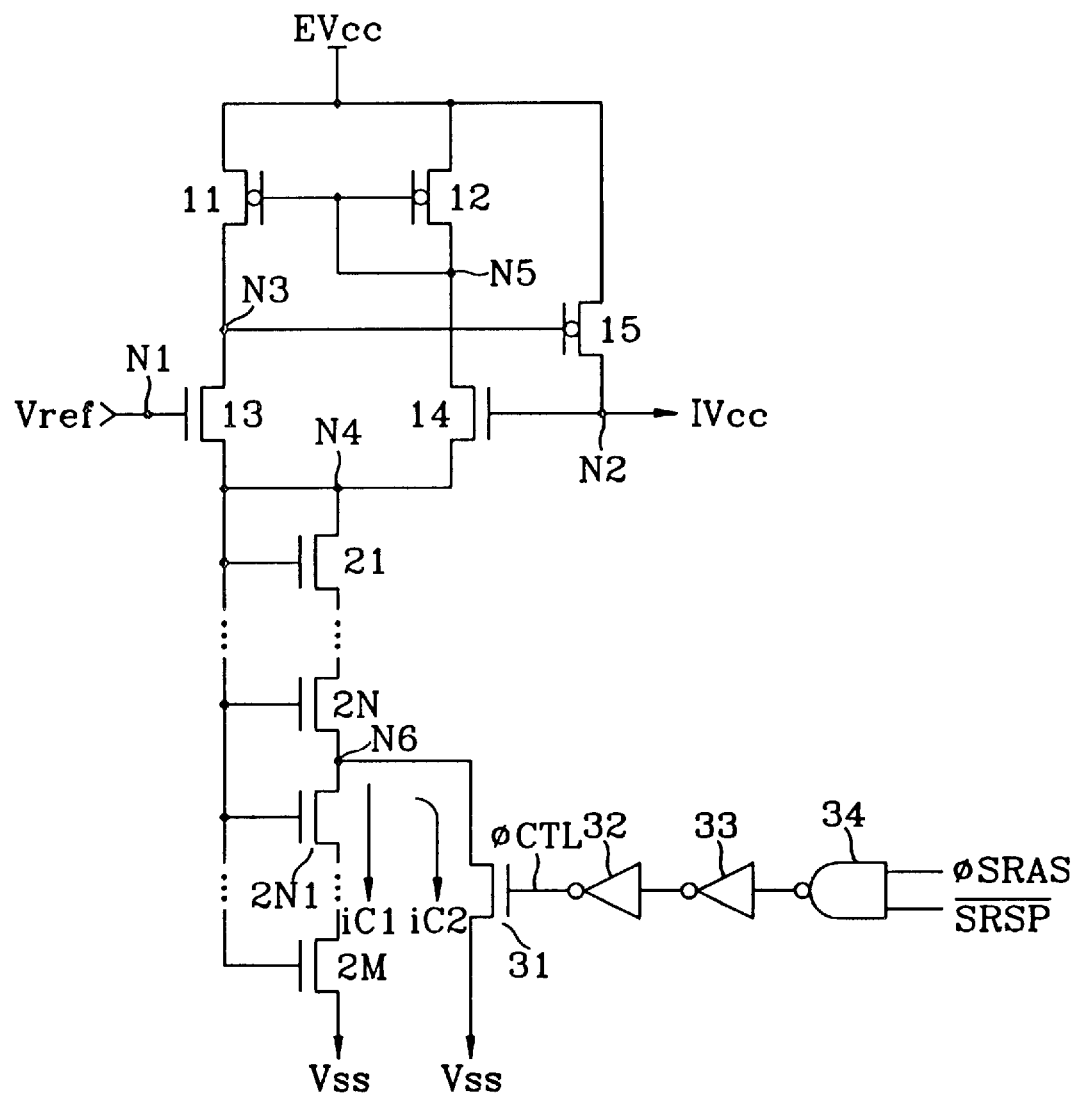
FIG. 2 is a block diagram illustrating the construction of an internal power supply circuit for a semiconductor memory device which is constructed according to the principles of the present invention.

In FIG. 2, a PMOS transistor 11 is connected between an external power supply voltage EVcc and a node N3. A PMOS transistor 12 is connected between the external source voltage EVcc and a node N5. Gate electrodes of PMOS transistors 11, 12 are commonly coupled to node N5. An NMOS transistor 13 is connected between node N3 and a node N4. A gate electrode of transistor 13 is coupled to a node N1 to which a reference voltage Vref is applied. An NMOS transistor 14 is connected between node N5 and node N4. The gate of transistor 14 is coupled to a node N2 which supplies the internal power supply voltage IVcc generated by the circuit of FIG. 1. Each gate electrode of one or more NMOS transistors 21-2N, which are serially connected between node N4 and a node N6, is connected in common to node N4. A PMOS transistor 15 is connected between the external power supply voltage EVcc and node N2. The gate of transistor 15 is coupled to node N3.

Here, a current path iC1 is formed through NMOS transistors 2N1-2M, referred to herein as a first current path. An NMOS transistor 31 is connected between a node N6 and the ground voltage Vss. Transistor 31 includes a gate electrode coupled to a mode control signal ΦCTL. A current path iC2 is formed through NMOS transistor 31 and is referred to herein as a second current path. A NAND gate 34 inputs a self refresh master signal ΦSRAS and a self refresh setup pulse signal nSRSP, depicted in the drawings by SRSP with a bar thereover. The self refresh setup pulse signal nSRSP is enabled as a high logic signal with delay (i.e., about 100 microseconds) after a CBR refresh operation is set up. The self refresh setup pulse signal nSRSP is generated during the refresh operation in the self-refresh mode. Inverters 32, 33 are connected between an output terminal of the NAND gate 34 and the gate electrode of the NMOS transistor 31. The mode control signal ΦCTL appears on the output of inverter 32 which is tied to the gate electrode of the NMOS transistor 31.

Figure 3:
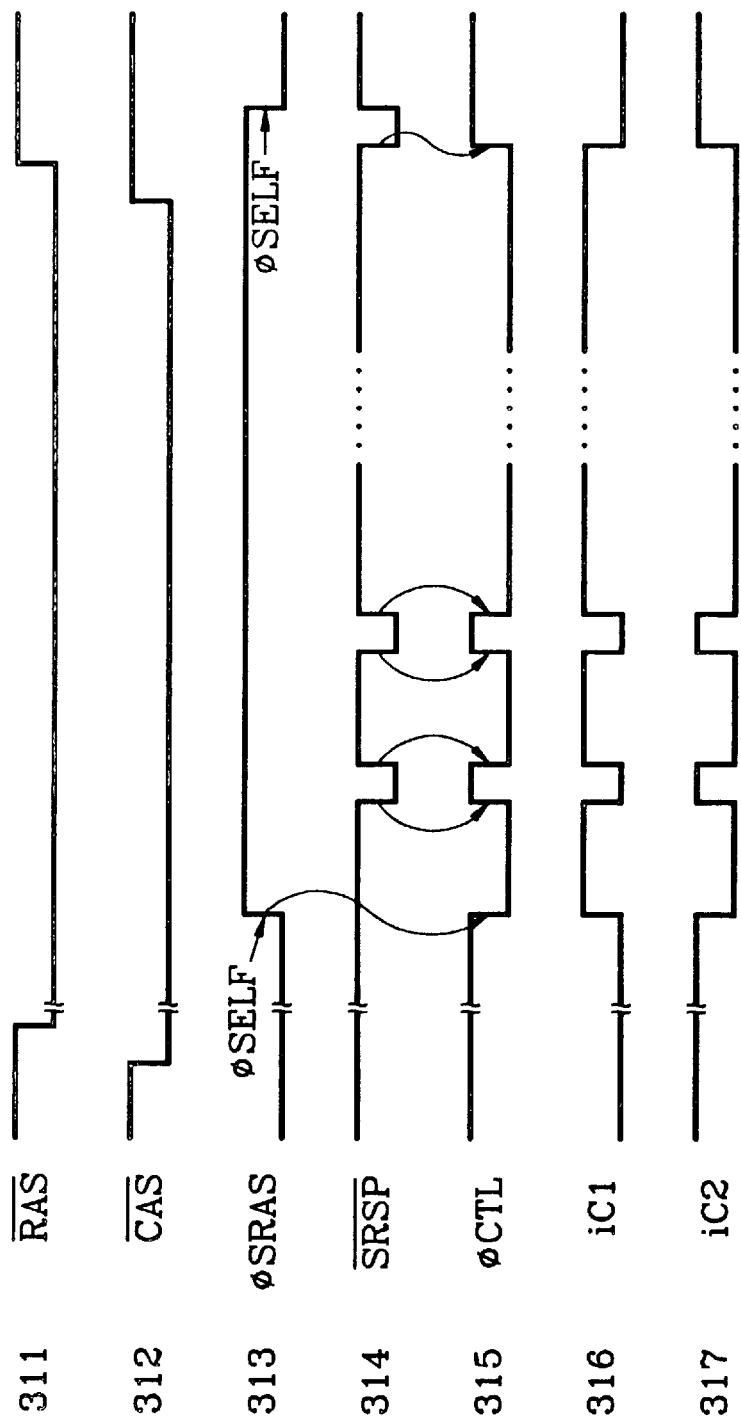
FIG. 3 is a block diagram illustrating relative operation of components in FIG. 2.

FIG. 3 is a block diagram illustrating operation of components in FIG. 2. An explanation on the operation of the internal power supply circuit is provided in the following.

As mentioned hereinbefore, the internal power supply circuit has a differential amplifier circuit having as a first input reference voltage Vref and as a second input a feedback signal which is proportional to voltage IVcc. Here, the reference voltage Vref should be set to the desired internal power supply voltage IVcc. A direct current (DC) of the differential amplifier circuit is determined by the first current path iC1 which is formed by NMOS transistors 21-2N and 2N1-2M and by the second current path iC2 which is formed by the NMOS transistors 21-2N and 31. NMOS transistor 31 is turned on, then to form the second current path iC2 during operations when fast operation of the differential amplifier is required and a voltage drop in IVcc must be recovered rapidly. NMOS transistor 31 is turned off then to form only first current path iC1 through the NMOS transistors 2N1-2M. Current consumption can thus be reduced.

As stated previously, the current for the power supply is controlled by the NMOS transistors 2N1-2M and 31 which are connected serially between the node N6 and the ground voltage Vss. With reference to FIG. 3 when the row address strobe signal nRAS 311, depicted in the drawing by RAS with a bar thereover, changes into a low logic signal after a column address strobe signal, nCAS 312, depicted in the drawing by CAS with a bar thereover, is maintained in a low logic state for a predetermined time (about 100 microseconds), the self refresh master signal ΦSRAS 313 changes into a high logic state. Moreover, the self refresh setup pulse signal nSRSP 314 changes into a low logic state for a predetermined time. Accordingly, NAND gate 34 NANDs the self refresh mode master signal ΦSRAS and the self refresh setup pulse signal nSRSP and the inverters 33 and 32 generate the mode control signal ΦCTL 315 in accordance with the output of the NAND gate 34. The mode control signal ΦCTL therefore changes into a high logic signal when the refresh operation is performed during the self refresh mode and is maintained in a the low logic state during the precharge operation of the self refresh mode.

The mode control signal ΦCTL is applied to the gate electrode of NMOS transistor 31. Consequently, when the mode control signal ΦCTL is in a low logic state, NMOS transistor 31 is turned off and the second current path iC2 is closed, so that only current path iC1 is formed through the NMOS transistors 2N1-2M. Since the NMOS transistors 2N1-2M each have great channel resistance, the current flowing through the first current path iC1 to VSS, as shown by 316 of FIG. 3, becomes extremely small. Excess current consumption during precharge operation in self refresh mode can therefore be prevented.

However, when the precharge mode changes into the refresh mode, the mode control signal ΦCTL goes to a high logic state as shown by 315 of FIG. 3. Thus, when NMOS transistor 31 turns on, the second current path iC2 is formed through the NMOS transistors 21-2N and 31. In such a case, because NMOS transistor 31 serves as a switching element having a normal channel size, the current path is formed to be greater than the first current path iC1. Therefore, even if the internal power supply voltage IVcc at the output node N2 drops during operations in the self refresh mode, when the second current path iC2 is formed by the NMOS transistor 31, the internal source voltage IVcc at output node N2 rapidly responds to provide a stable power supply.

As is apparent from the foregoing, the power supply circuit of the present invention turns on or off a MOS transistor dependent upon the consumption of power during the self refresh mode. Such control is exerted by determining the current path, and by adjusting the amount of current, using MOS transistors. This results in less direct current being consumed by the internal power supply.

While the present invention has been illustrated and described as an example of what is considered to be a preferred embodiment, it will be understood by those skilled in the art that various changes in form and details may be effected therein without departing from the spirit and scope of the invention.

We claim:

1. An internal power supply circuit for a semiconductor memory device comprising:

an amplifier having an input terminal for a reference voltage and being operatively connected to an external power supply circuit, said amplifier generating an internal power supply voltage substantially equal to said reference voltage;

a current source for said amplifier, said current source having a first state for providing a high level of current when the semiconductor memory device draws a first amount of current from said internal power supply and a second state for providing a low level of current when the semiconductor memory device draws a second amount of current;

wherein said current source is in said first state during a refresh operation; and wherein said current source is in said second state during a precharge operation.

2. The circuit of claim 1 wherein said refresh and precharge operations occur when said semiconductor memory device is in a self-refresh mode.

3. The power supply circuit of claim 1 wherein said current source further comprises a plurality of transistors operatively connected to said amplifier, at least one of said transistors being biased to a first state when said source is in said first source state and to a second state when said source is in a second source state.

4. The power supply circuit of claim 3 wherein a plurality of said transistors are serially connected between said amplifier and a second voltage and wherein a current control transistor is connected in parallel with said serially connected transistors, said current control transistor being biased substantially on when said current source is in said first state and being biased substantially off when said current source is in said second state.

5. The power supply circuit of claim 4 wherein said power supply circuit further includes a logic circuit operatively connected to said current control transistor, said logic circuit having a self-refresh master signal and a self-refresh setup pulse signal as inputs, said signals being generated by a circuit in said semiconductor memory device.

6. The power supply circuit of claim 5 wherein said first state corresponds to a refresh operation and wherein said second state corresponds to precharge operation in said semiconductor memory device.

7. An internal power supply circuit for a semiconductor memory device comprising an amplifier:

a first node on said amplifier for receiving a reference voltage;

a second node on said amplifier for receiving a first side of an external power supply voltage;

a third node on said amplifier for supplying an internal power supply voltage;

a fourth node on said amplifier operative connected to a current source, said current source comprising a plurality of transistors connected in series between said fourth node and second side of said external power supply voltage;

a current control transistor having a channel larger than the channels of the transistors connected in series, said current control transistor being switchable between a first state in which said current control transistor is substantially on and a second state in which said current control transistor is substantially off;

wherein said current is in said first stated during a refresh operation;

wherein said amplifier is a differential amplifier; and wherein said refresh and precharge operations occur when said semiconductor memory device is in self-refresh mode.

8. The circuit of claim 7 wherein said amplifier is a differential amplifier.

9. The power supply circuit of claim 7 wherein said power supply circuit further includes a logic circuit operatively connected to said current control transistor, said logic circuit having a self-refresh master signal and a self-refresh setup pulse signal as inputs, said signals being generated by a circuit in said semiconductor memory device.

10. The power supply circuit of claim 9 wherein said first state corresponds to a refresh operation and wherein said second state corresponds to precharge operation in said semiconductor memory device.

11. The power supply circuit of claim 7 wherein said transistors are MOSFET transistors.

12. An internal power supply circuit for a semiconductor memory device comprising an amplifier;

a first node on said amplifier for receiving a reference voltage;

a second node on said amplifier for receiving a first side of an external power supply voltage;

a third node on said amplifier for supplying an internal power supply voltage;

a fourth node on said amplifier operatively connected to a current source, said current source comprising a plurality of transistors connected in series between said fourth node and a second side of said external power supply voltage;

a current control transistor having a channel larger than the channels of the transistors connected in series, said current control transistor being switchable between a first state in which said current control transistor is substantially on and a second state in which said current control transistor is substantially off; and wherein said power supply circuit further includes a logic circuit operatively connected to said current control transistor, said logic circuit having a self-refresh master signal and a self-refresh setup pulse signal as inputs, said signals being generated by a circuit in said semiconductor memory device.

13. The power supply circuit of claim 12 wherein said first state corresponds to a refresh operation and wherein said second state corresponds to precharge operation in said semiconductor memory device.

* * * * *